US011477915B2

(12) United States Patent
Chen et al.

(10) Patent No.: US 11,477,915 B2
(45) Date of Patent: Oct. 18, 2022

(54) SYSTEMS FOR COOLING ELECTRONIC COMPONENTS IN A SEALED COMPUTER CHASSIS

(71) Applicant: QUANTA COMPUTER INC., Taoyuan (TW)

(72) Inventors: Yi-Chieh Chen, Taoyuan (TW); Yueh-Chang Wu, Taoyuan (TW); Te-Chuan Wang, Taoyuan (TW); Tzu-Hsuan Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 9 days.

(21) Appl. No.: 17/149,151

(22) Filed: Jan. 14, 2021

(65) Prior Publication Data
US 2022/0225541 A1 Jul. 14, 2022

(51) Int. Cl.
*H05K 7/20* (2006.01)
(52) U.S. Cl.
CPC ..... *H05K 7/20409* (2013.01); *H05K 7/20336* (2013.01); *H05K 7/20818* (2013.01)
(58) Field of Classification Search
CPC .................. H05K 7/20409; H05K 7/20336
See application file for complete search history.

(56) References Cited

U.S. PATENT DOCUMENTS 8,072,763 B2 12/2011 Li et al.
2010/0027220 A1* 2/2010 Hughes .............. H05K 7/20509
361/702
2010/0313590 A1 12/2010 Campbell et al.
2013/0303264 A1* 11/2013 Gill ..................... G07F 17/3216
312/236
2013/0329356 A1* 12/2013 Shanbhogue .......... H05K 1/144
361/714
2016/0299545 A1* 10/2016 May ....................... G06F 1/187
2019/0269005 A1 8/2019 He et al.
(Continued)

FOREIGN PATENT DOCUMENTS

CN 2907191 Y 5/2007
CN 201608970 U 10/2010
CN 201894038 U 7/2011
(Continued)

OTHER PUBLICATIONS

TW Office Action for Application No. 110117988 dated Nov. 5, 2021, w/ First Office Action Summary.
(Continued)

*Primary Examiner* — Mukundbhai G Patel
(74) *Attorney, Agent, or Firm* — Nixon Peabody LLP

(57) ABSTRACT

A computing device includes a sealed computer chassis housing, a heat source, a heat spreader, and a thermal pad. The sealed computer chassis housing, defines an interior space and an exterior surface with a heat sink for the interior space. The heat source is disposed within the interior space. The heat spreader includes a plurality of thermally-conductive protrusions coupled to one or more components of the heat source by an intermediate thermally conductive layer. The thermal pad is positioned above and in thermal contact with the heat spreader. The thermal pad is positioned to contact an interior wall of the sealed computer chassis housing opposite to the heat sink.

18 Claims, 10 Drawing Sheets

(56) References Cited

U.S. PATENT DOCUMENTS

2020/0154606 A1   5/2020   Hur et al.
2021/0005527 A1   1/2021   Choi et al.

FOREIGN PATENT DOCUMENTS

TW    200844723 A   11/2008
TW    201640993 A   11/2016
TW      I607687 B   12/2017

OTHER PUBLICATIONS

TW Search Report for Application No. 110117988 dated Nov. 5, 2021, w/ First Office Action.
Extended European Search Report for EP Application No. 21176857.7, dated Nov. 30, 2021.

* cited by examiner

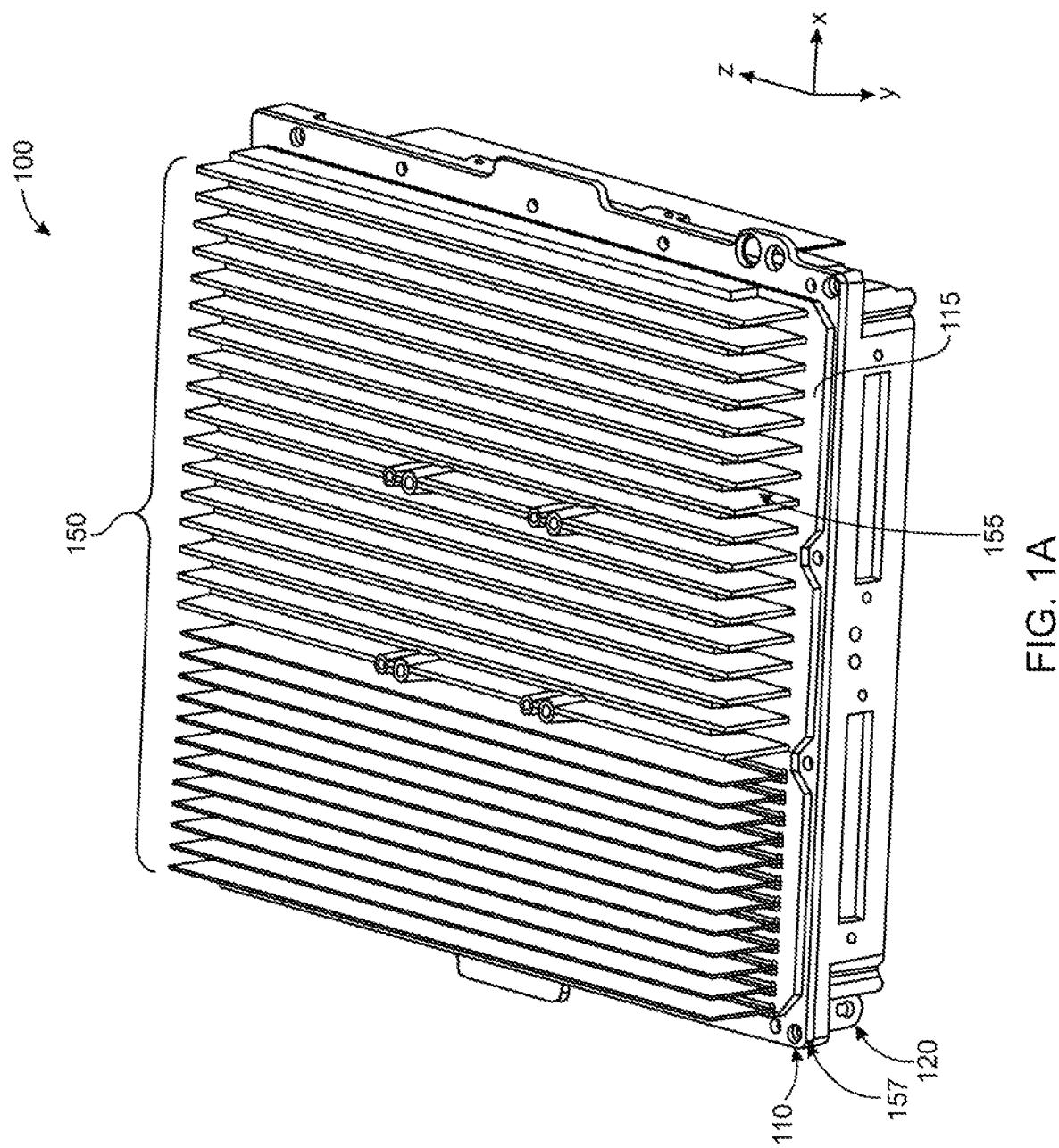

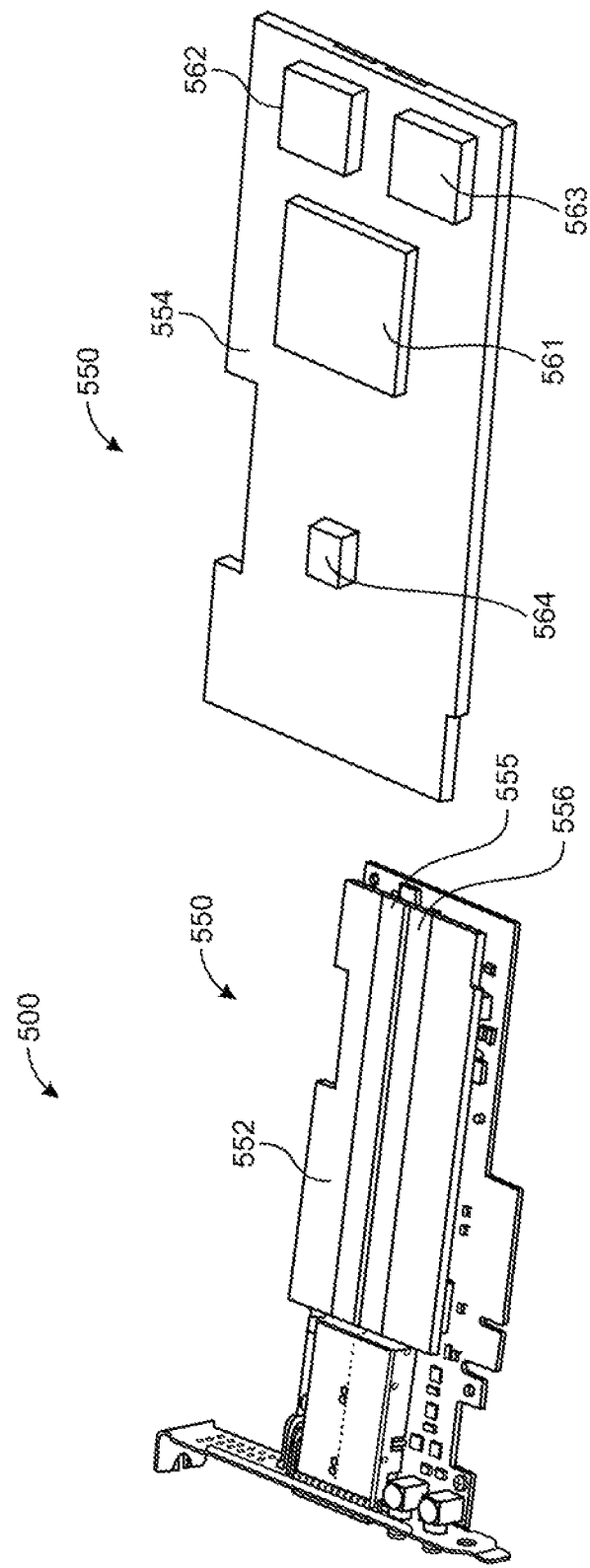

SYSTEMS FOR COOLING ELECTRONIC COMPONENTS IN A SEALED COMPUTER CHASSIS

FIELD OF THE INVENTION

The present disclosure generally relates to computing systems. More specifically, the present disclosure relates to computing systems for cooling electronic components in a sealed computer chassis.

BACKGROUND

Computing systems, such as those used for outdoor electronic telecommunications, require increasingly higher computing performance. Computing systems used in an outdoor environment need to be placed inside dustproof and waterproof housings. For outdoor electronic computing equipment, the housing for the computing systems typically acts as a heat sink for cooling the internal heat-generating electronic components. High-performance electronic components in computing systems, such as heat-generating components connected to high-performance expansion cards, cause increased heat generation within a computer chassis of such computing systems.

SUMMARY

According to one embodiment, a computing system includes a scaled computer chassis housing, a plurality of heat-generating components, a heat spreader, and a thermal pad. The sealed computer chassis housing defines an interior space and an exterior surface with a heat sink for the interior space. The plurality of heat-generating electronic components are disposed within the interior space and electrically coupled to one or more expansion cards electrically connected on a main hoard. The plurality of heat-generating electronic components include one or more microprocessor and one or more memory devices. The heat spreader includes a plurality of thermally-conductive protrusions coupled to the one or more microprocessors or one or more memory devices by an intermediate thermally conductive layer. The thermal pad is positioned above and in thermal contact with the heat spreader. The thermal pad is positioned adjacent to an interior wall of the sealed computer chassis housing opposite the heat sink.

According to another embodiment, a computing device includes a sealed computer chassis housing, a heat source, a heat spreader, and a thermal pad. The sealed computer chassis housing defines an interior space and an exterior surface with a heat sink for the interior space. The heat source is disposed within the interior space. The heat spreader includes a plurality of thermally-conductive protrusions coupled to one or more components of the heat source by an intermediate thermally conductive layer. The thermal pad is positioned above and in thermal contact with the heat spreader. The thermal pad is positioned to contact an interior wall of the sealed computer chassis housing opposite the heat sink.

In further aspects of the embodiments, the heat spreader includes one or more heat pipes. In some embodiments, the heat pipes are disposed on to top surface of the heat spreader opposite w the plurality of thermally-conductive protrusions. The heat from the heat source or the one or more microprocessors or one or more memory devices is distributed along the heat spreader. In further aspects of the embodiments, the heat spreader includes a vapor chamber on a top surface of the heat spreader opposite to the plurality of thermally-conductive protrusions. In some embodiments, the heat from the one or more microprocessor or the one or more memory devices is distributed along the heat spreader.

In further aspects of the embodiments, the heat sink includes a plurality of fins protruding orthogonally to the exterior surface of the sealed computer or server chassis housing, in some embodiments, the plurality of fins is oriented such that heat transferred to the heat sink rises out of air gaps between adjacent fins. In yet further aspects of the embodiments, the heat sink includes one heat sink disposed on the exterior surface of a first side of the sealed computer or server chassis housing and a second heat sink disposed on the exterior surface of a second side of the sealed computer or server chassis housing.

In further aspects of the embodiments, a height of the plurality of fins is greater than about five-times a width of a gap between adjacent spaced fins. In some embodiments, at least one expansion card is an expansion card for enhancing the computing system performance. In some embodiments, the intermediate thermally-conductive layer includes thermally-conductive grease. In some embodiments, the plurality of thermally conductive protrusions includes protrusions of at least two different heights.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

FIG. 1A depicts a top perspective view of an exemplary sealed computer chassis housing for outdoor use including a heat sink, according to some implementations of the present disclosure.

FIG. 5A depicts a top perspective view of an exemplary expansion card with beat-generating electronic components including a heat spreader with a heat pipe, according to some implementations of the present disclosure.

FIG. 5B depicts a bottom perspective view of the heat spreader of FIG. 5A including thermally conductive protrusions from the bottom surface, according to some implementations of the present disclosure.

Figure 1B:
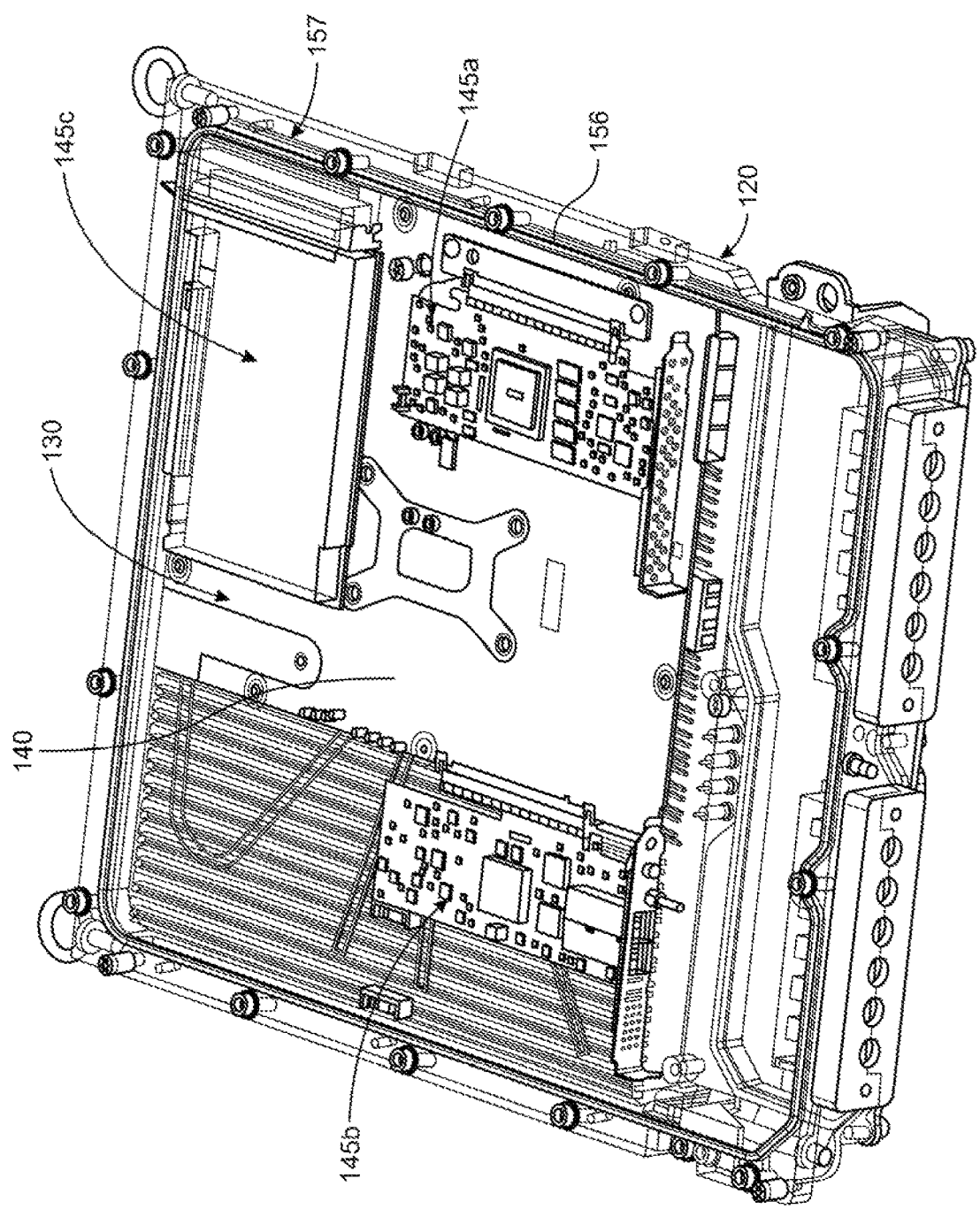
FIG. 1B depicts a top perspective view of an interior space of the exemplary sealed computer chassis housing of FIG. 1A with one of the housing covers removed, according to some implementations of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at,", "near," or "nearly at," or "within 3-5% of," or "within, acceptable manufacturing tolerances," or any logical combination thereof, for example.

With regards to the present disclosure, the terms "computing system" or "computing device" refer to any electronically-powered or battery-powered equipment that has hardware, software, and/or firmware components, where the software and/or firmware components can be configured, for operating features on the device. The term "coupled" means connected, whether directly or indirectly through intervening components, and is not necessarily limited to physical connections. The connection can be such that the objects are permanently connected or releasably connected. The term "substantially" is defined to be essentially conforming to the particular dimension, shape, or other word that substantially modifies, such that the component need not be exact. For example, substantially cylindrical means that the object resembles a cylinder, but can have one or more deviations from a true cylinder.

The present technology relates to a computing device including a heat source disposed in a server chassis housing or a computer chassis housing. The computing device has a sealed chassis housing that defines an interior space, along with an exterior surface with a heat sink. The heat sink can include spaced fins protruding orthogonally to an exterior surface of the housing. The spaced fins draw heat away from heat sources disposed in the interior space, such as electronic components. The chassis housing is preferably dustproof and waterproof such that the electronic components in the interior space of the computer chassis housing remain operable and do not become damaged by the elements in an outdoor environment, such as when positioned on a mounting pole for telecommunication equipment. A heat spreader having, for example, a plurality of thermally conductive protrusions, is coupled to One or more of the heal sources by an intermediate thermally-conductive layer. In addition, a thermal pad may be positioned above and in thermal contact with the heat spreader. For example, the thermal pad may be positioned to be in physical contact with an interior wall of the computer chassis housing such that it is opposite the heat sink on the exterior surface.

The present technology is contemplated to be beneficial in cooling closed interior spaces having heat sources (e.g., heat-generating electronic components), that do not bring in, or circulate, cooler ambient air to replace warmer air in the interior space. In some implementations, the interior space may not be entirely closed but may have limitations on bringing in or circulating cooling air.

The present technology provides a solution to heat dissipation issues for heat-generating high-performance outdoor computing equipment where forced convection is not a desirable option. For example, it can be desirable to have a plurality of high-performing electronic components within a chassis housing of an outdoor computing device in fifth-generation mobile network architecture. The present technology provides a unique thermal solution for equipment in which a traditional forced convection system cannot be effectively used to cool the heat-generating components.

In some implementations, the computing system is a finless cooling system with two or more high-performance expansion cards, such as peripheral component interface express (PCIe) cards with heat-generating processing units. The computer chassis housing acts as a heat sink for cooling the heat-generating processing units located inside the computer chassis housing. The tailless cooling system can include thermal pad(s), spaced fins protruding from the exterior surface of the chassis housing, thermally conductive grease or paste, a heater spreader, and thermally conductive protrusions extending from the heat spreader. It is contemplated that such a finless cooling system can dissipate heat at a rate of approximately 100 Watts or more (e.g., greater than about 340 BTU/hour).

Referring now to FIG. 1A, a top perspective view of an exemplary computer chassis housing 100 is depicted for outdoor use. The computer chassis housing 100 is sealed and includes an exterior surface 115 and an interior space (not shown). A plurality of spaced fins 150 is disposed on the exterior surface and acts as a heat sink. The computer chassis housing 100 includes at least two housing enclosure components 110, 120 that are secured together to form a dustproof and waterproof interface 157 generally along the x-z plane between the two housing enclosure components 110, 120. The computer chassis housing 100 protects electronic con components disposed within the interior space of the chassis housing 100.

The plurality of spaced fins ISO are spaced along the exterior surface 115, generally parallel to the x-z plane of the housing enclosure component 110. The plurality of spaced fins 150 may similarly be positioned on the exterior surface 115 of the housing enclosure component 120, as partially depicted and discussed in more detail below for FIG. 1C. During operation of electronic components within the computer chassis housing 100, ambient air will be heated at the exterior surface 115 of the computer chassis housing 100 and flow through air gaps (e.g., gap 155) between adjacent fins. Natural convection due to the pressure differential between the heated ambient air in the gaps and the surrounding ambient air will drive the heated air upwards and away from the exterior surfaces 115. In some implementations, the computer chassis housing 100 has a width along the x-axis of approximately six to seven inches or greater, which allows a sufficient number of fins 150 to be placed on the exterior surface 115 of the housing enclosure components 110, 120 to meet the heat dissipation demands of heat-generating electronic components (not shown) disposed within the computer chassis housing 100.

Referring to FIG. 1B, a top perspective view of the interior space 130 of the exemplary computer chassis housing 100 of FIG. 1A, is depicted. FIG. 1B shows the computer chassis housing 100 with the housing enclosure component 110 removed and a seal 156 disposed at the interface 157 between housing enclosure components 110 (not shown), 120 providing a dustproof and waterproof environment for the interior space 130. A plurality of exemplary electronic components, including a main board 140, such as a motherboard, and multiple high-performance expansion cards 145a, 145b, 145c are further depicted.

Figure 1C:
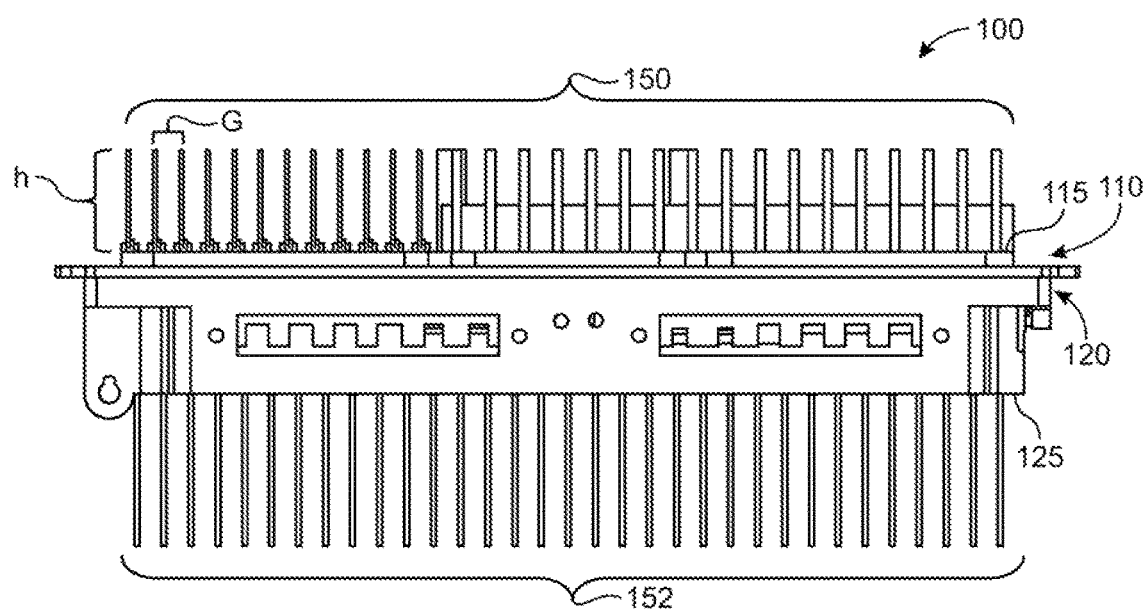
FIG. 1C depicts a side view of the exemplary sealed computer chassis housing of FIG. 1A, according to some implementations of the present disclosure.

Referring to FIG. 1C, a side view of the exemplary computer chassis housing 100 of FIG. 1A is depicted. The two housing enclosure components 110, 120 have the plurality of spaced fins 150 protruding orthogonally away from the exterior surface 115 of the housing enclosure component 110. In some implementations, a second plurality of spaced fins 152 protrude orthogonally away from an exterior surface 125 of the housing enclosure component 120. The plurality of spaced fins 150, 152 are oriented such that heat transferred to the heat sink created by the spaced fins 150, 152 rises taut of the air gaps 155 between adjacent spaced fins 150, 152. To allow for air flow in the air gaps 155 between adjacent fins 150, 152 and provide for natural convection, in some implementations the width of the air gap 155, denoted as G, is in the range of about 0.2 inches to 0.6 inches and the spaced fin height, h, is in the range of about two inches to about eight inches. In some implementations, the height, h, of the spaced fins 150, 152 is greater than about five-times the width G of the air gap 155 between adjacent spaced fins 150, 152. The width of each individual fin of spaced fins 150, 152 can range from about 0.03 inches to 0.2 inches.

Figure 2:
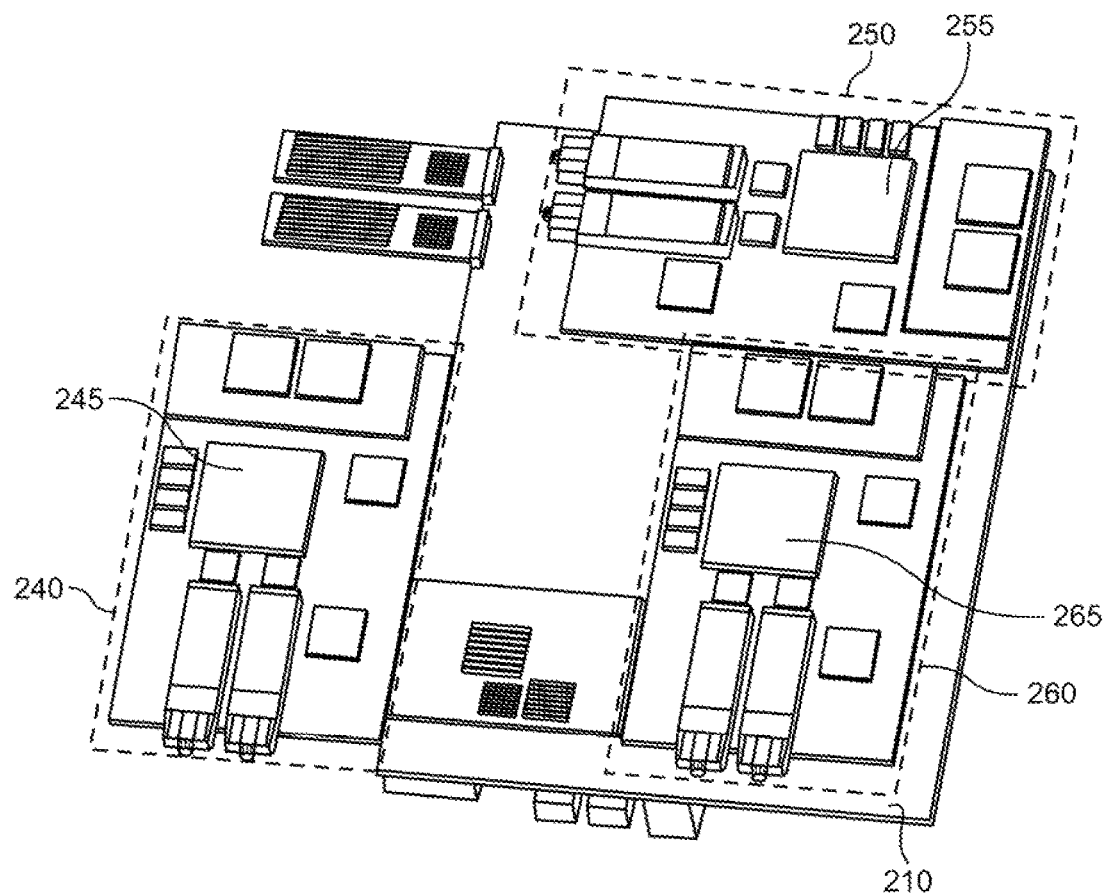
FIG. 2 depicts a top perspective view of a plurality of expansion cards coupled to a main hoard that are disposed in the interior space of a sealed computer chassis housing, according to some implementations of the present disclosure.

Turning now to FIG. 2, a top perspective view of a plurality of expansion cards 240, 250, 260 coupled to a main board 210, is depicted. The main board 210 is disposed in the interior space 130 of the sealed computer chassis housing 100 in FIG. 1A. The exemplary expansion cards 240, 250, 260 may include any of a number of heat-generating electronic components. For example, the expansion cards 240, 250, 260 may he PCIe cards having microprocessors 245, 255, 265 and memory devices respectively. The microprocessors 245, 255, 265 typically generate a large amount of heat, and thus, must be cooled for operation of the expansion cards 240, 250, 260. In one example, the microprocessors 245, 255, 265 may be field-programmable gate arrays (FPGAs).

Figure 3A:
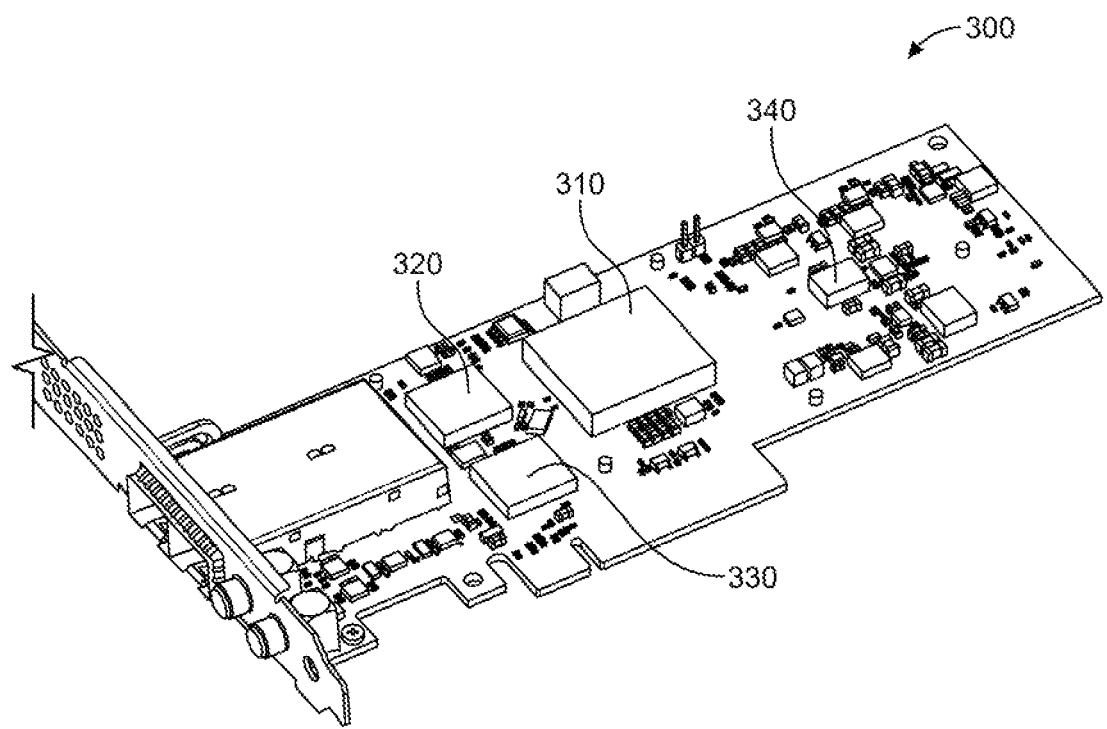
FIG. 3A depicts a top perspective view of an exemplary expansion card including heat-generating electronic components coupled thereto, according to some implementations of the present disclosure.

FIG. 3A depicts a top perspective view of an exemplary expansion card 300, similar to the expansion cards 240, 250, 260. The expansion card 300 includes heat-generating electronic chip components 310, 320, 330, 340 coupled thereto. The electronic chip components 310, 320, 330, 340 have non-uniform heights, as exemplified by electronic chip components 320, 330 compared to the electronic chip component 310. The electronic chip component 310 is a primary microprocessor chip and generates a large amount of heat. The other electronic chip components 320, 330, 340 may perform other secondary operations and generate less heat than the main chip.

Figure 3B:
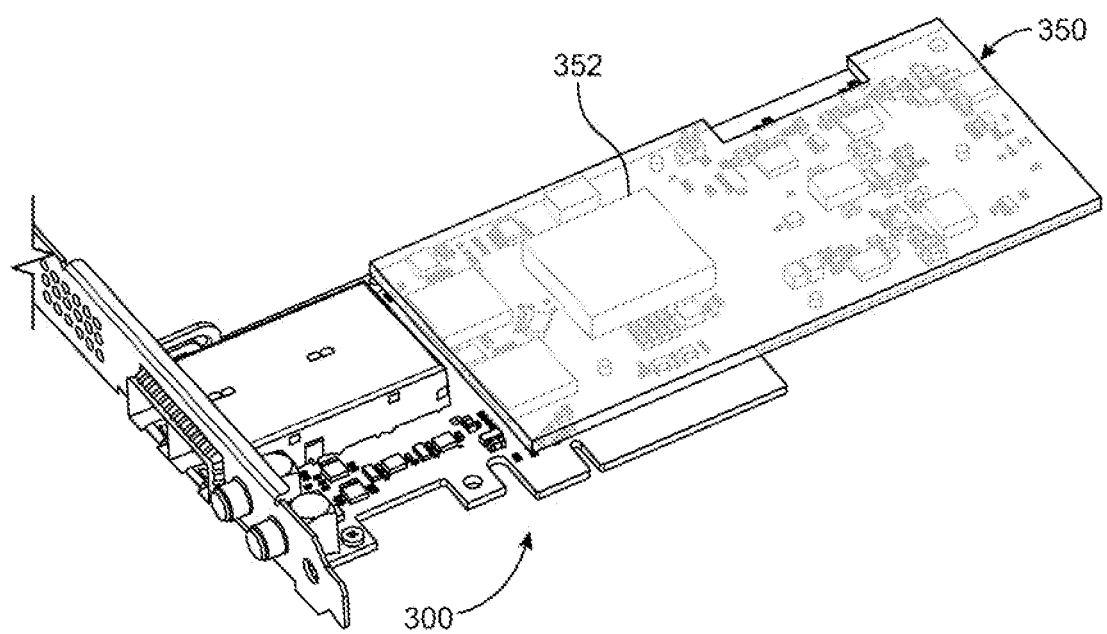
FIG. 3B depicts a top perspective view of an exemplary expansion card including the heat-generating electronic components of FIG. 3A with a top perspective view of heat spreader positioned on top of the expansion card, according to some implementations of the present disclosure.

FIG. 3B depicts a top perspective view of the exemplary expansion card 300 as visible through a heat spreader 350 partially covering the expansion card 300. The heat spreader 350 has a planar top surface 352 that does not include fins and a bottom surface 354 (see FIG. 3C). The heat spreader 350 assists with the transfer of heat energy away from each of the heat-generating electronic components 310, 320, 330, 340 to heat sink, such as the plurality of spaced fins 150 (FIG. 1A-1C). The heat spreader 350 may be fabricated from any conductive material of high thermal conductivity, such as copper, aluminum, or alloys thereof.

Figure 3C:
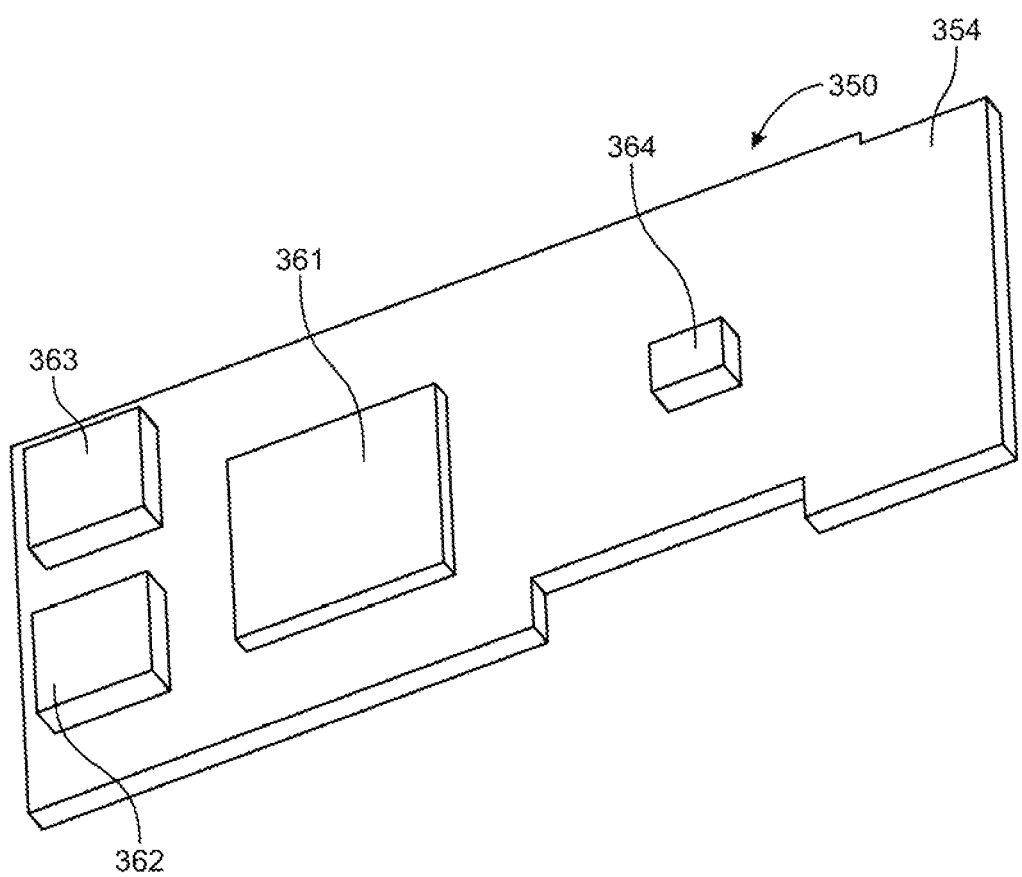
FIG. 3C depicts a bottom perspective view of the heat spreader of FIG. 3B including thermally conductive protrusions from the bottom surface, according to some implementations of the present disclosure.

FIG. 3C depicts a bottom perspective view of the heat spreader 350 of FIG. 3B including thermally-conductive protrusions 361, 362, 363, 364 extending from the bottom surface 354 of the heat spreader 350. The thermally-conductive protrusions 361, 362, 363, 364 are fabricated so that when the heat spreader 350 is placed over the expansion card 300, one or more of the thermally-conductive protrusions 361, 362, 363, 364 align vertically and horizontally with the top surfaces of the heat-generating electronic components 310, 320, 330, 340. The heat-generating electronic components can include, for example, microprocessors or memory devices. The thermally-conductive protrusions 361, 362, 363, 364 can be coupled to the heat-generating electronic components 310, 320, 330, 340 by an intermediate thermally-conductive layer, such as a thermal pad, thermal grease, or thermal paste. The thermally-conductive protrusions 361, 362, 363, 364 can be fabricated from the same thermally-conductive material as the heat spreader 350.

Figure 4A:
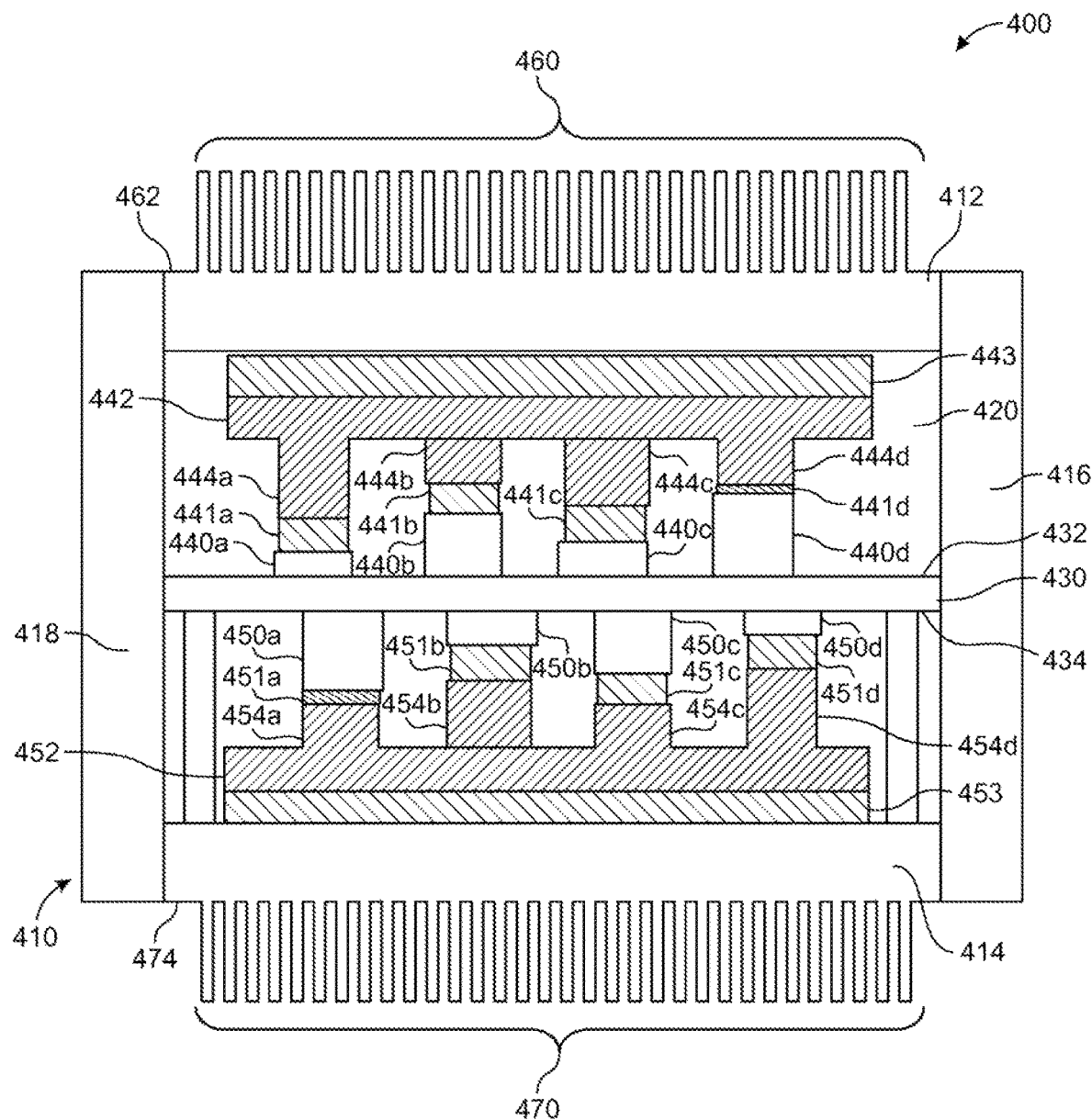
FIGS. 4A and 4B depict cross-sectional diagrams through an exemplary sealed computer chassis housing that includes a heat sink, a heat spreader, and thermal pads, according to some implementations of the present disclosure.
Figure 4B:
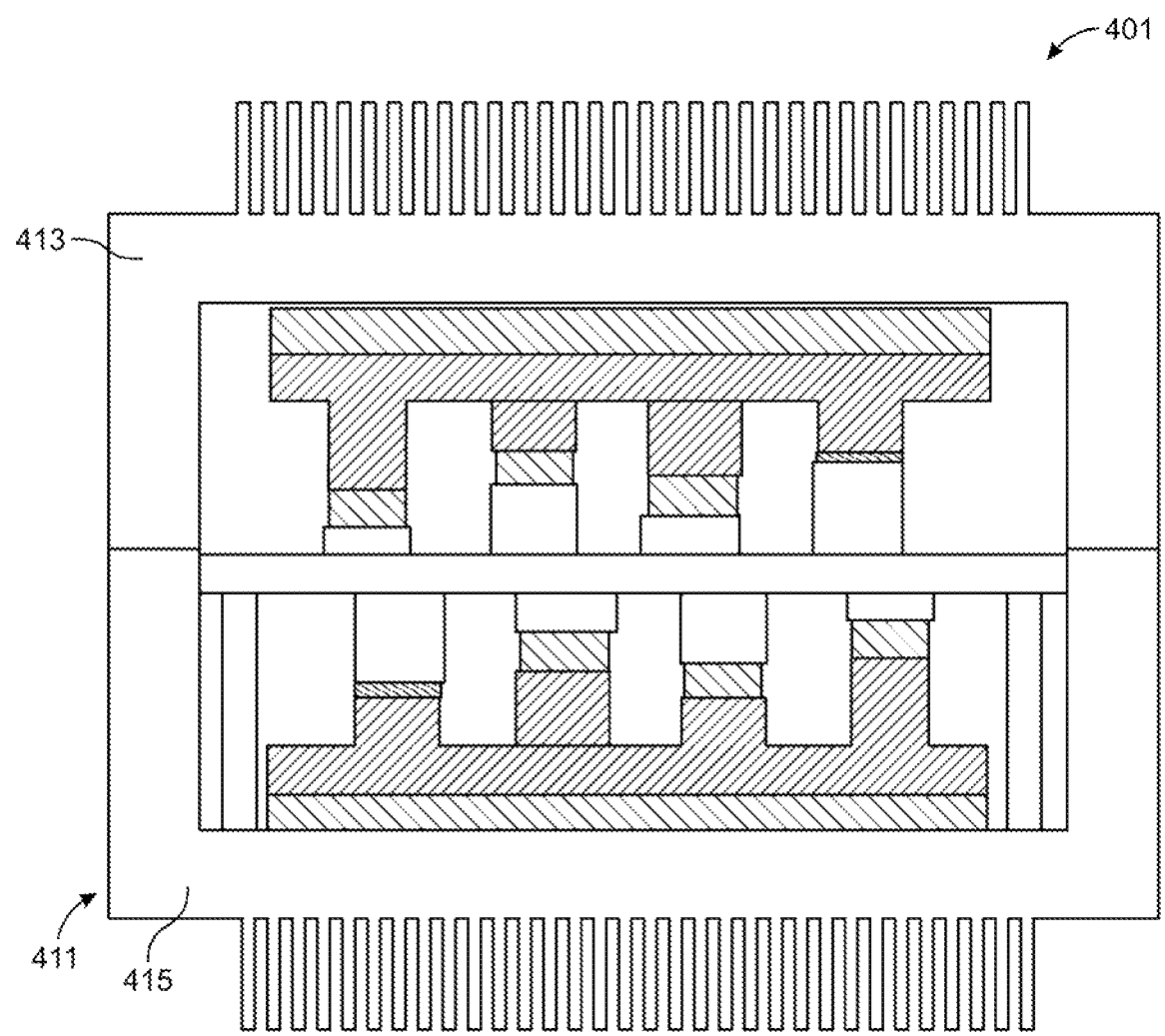

Turning now to FIGS. 4A and 4B, cross-sectional diagrams of exemplary computing systems 400, 401, are depicted. Referring to FIG. 4A, the computing system 400 includes a computer chassis housing 410 comprising a top housing component 412, a bottom housing component 414, and side walls 416, 418. The interfaces between the housing components 412, 414, 416, 418 are sealed such that the computer chassis housing provides a dustproof and waterproof enclosure for electronic components 440a-d, 450a-d disposed in an interior space 420 of the computer chassis housing. Heat spreaders 442, 452 include thermally-conductive protrusions 444a-d, 454a-d that assist with transferring heat from their respective electronic components 440a-d, 450a-d to thermal pads 443, 453 and then to the top housing component 412 and the bottom housing component 414, respectively. The thermally-conductive protrusions 444a-d, 454a-d can be coupled to their respective electronic components 440a-d, 450a-d using, for example, thermally-conductive pads 441a-c, 451b-d, thermally-conductive grease 441d, 451a, or combinations thereof. Other thermally-conductive coupling options are also contemplated within the scope of this disclosure.

The top housing component 412 and the bottom housing component 414 include a plurality of spaced fins 460, 470 extending orthogonally from exterior surfaces 462, 474 of the top housing component 412 and the bottom housing component 414, respectively. Collectively, the electronic components 440a-d, 450a-d can be referred to as heat sources. The combination of the plurality of spaced fins 460, the top housing component 412, the thermal pad 443, the heat spreader 442, the thermally-conductive protrusions 444a-d, and the thermally-conductive layers 441a-d can collectively, or in part, be referred to as a first heat sink for the heat sources 440a-d. Similarly, the combination of the plurality of spaced fins 470, the bottom housing component 414, the thermal pad 453, the heat spreader 452, the thermally-conductive protrusions 454a-d, and the thermally-conductive layers 451a-d can collectively, or in part, be referred to as a second heat sink for the heat sources 450a-d. It is contemplated that the computing system 400 can include different configurations of the described electronic component(s), space fins, housing components, thermal pad (s), heat spreader(s), thermally conductive protrusion(s), and thermally-conductive layer(s) within the interior space 420.

Referring to FIG. 4B, the computing system 401 includes similar components as described for computing system 400, except computer chassis housing 411 has a different exemplary housing configuration. The computer chassis housing 411 includes a first unitary housing enclosure component 413 and a second unitary housing enclosure component 415. The interface between the first and second housing enclosure components 413, 415 is sealed such that the computer chassis housing 411 provides a dustproof and waterproof enclosure for electronic components disposed within an interior space of the computer chassis housing 411.

The two-sided configuration with electronic components connected on both sides of a printed circuit board can provide a more efficient and more powerful computing system, while minimizing the number of sealed computer chassis housings. This can be beneficial, for example, in dense telecommunications networks.

Referring to FIG. 5A, a top perspective view of an exemplary expansion card 500 with heat-generating electronic components, such as the electronic components 310, 320, 330, 340 (FIG. 3A), is depicted. The expansion card 500 further includes a top surface 552, a bottom surface 554, a heat spreader 550 with one or more beat pipes 555, 556 positioned along the planar top surface 552 of the heat spreader 550. The heat spreader 550 assists with the transfer of heat energy away from the heat-generating electronic components to a heat sink.

Referring to FIG. 5B, a bottom perspective view of the heat spreader 550 of FIG. 5A, is depicted. The heat spreader 550 includes thermally-conductive protrusions 561, 562, 563, 564 extending from the bottom surface 554 of the heat spreader 550. The thermally-conductive protrusions 561, 562, 563, 564 are fabricated so that when the heat spreader 550 is placed over the expansion card 500, one or more of the thermally-conductive protrusions 561, 562, 563, 564 align vertically and horizontally with the top surfaces of the heat-generating electronic components (e.g., similar to electronic components 310, 320, 330, 340 in FIG. 3A). The thermally-conductive protrusions 561, 562, 563, 564 can be coupled to the heat-generating electronic components by an intermediate thermally-conductive layer, such as a thermal pad, thermal grease, or thermal paste, as described in FIG. 4. The thermally-conductive protrusions 561, 562, 563, 564 can be fabricated from the same thermally-conductive material as the heat spreader 550.

The heat pipes 555, 556 in FIG. 5A are disposed on the top surface 552 of the heat spreader 550 opposite to the plurality of thermally-conductive protrusions 561, 562, 563, 564 such that heat from the heat-generating electronic components (e.g., similar to electronic components 310, 320, 330, 340 in FIG. 3A) is distributed along the heat spreader 550. The heat pipes 555, 556 are fabricated from a material having a heat conductivity coefficient higher than the heat conductivity coefficient of the heat spreader 550, such that the heat is more uniformly distributed along the heat spreader 550, It is contemplated that the heat conductivity coefficient of the heat pipes 555, 556 is within a range of about 1,500 to 50,000 watts per meter-kelvin (W/m-K.). In some implementations, the heat conductivity coefficient of the heat spreader is within a range of about 100 to 500 W/m-K.

The heat pipes 555, 556 combine both the concepts of thermal conductivity and phase transition to effectively transfer heat between two solid interfaces. For example, at a hot interface of the heat pipe 555, 556, a liquid in contact with a thermally-conductive solid surface turns into a vapor by absorbing heat from that surface. The vapor then travels along the heat pipes 555, 556, to the cold interface and condenses back into a liquid, releasing the latent heat. The liquid then returns to the hot interface through either capillary action, centrifugal force, or gravity and the cycle repeats. Due to the very high heat transfer coefficients for boiling and condensation, the heat pipes 555, 556 are highly efficient thermal conductors, when incorporated into the systems described herein.

Figure 6B:
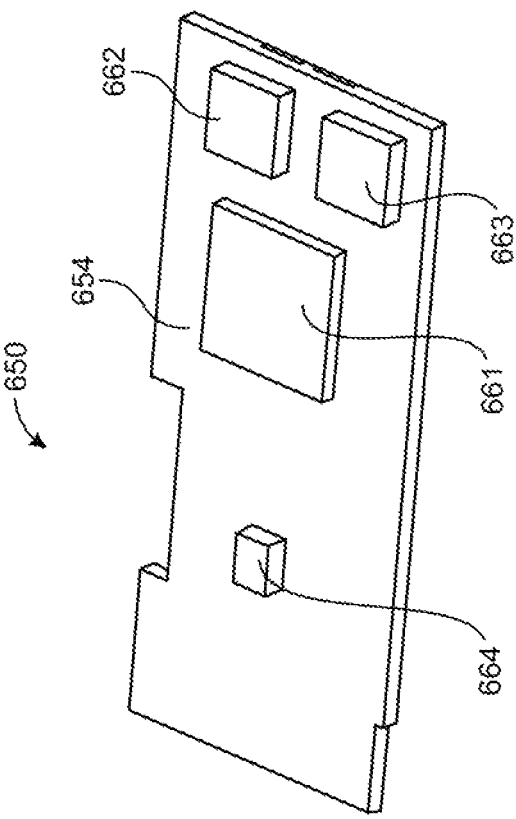
FIG. 6B depicts a bottom perspective view of the heat spreader of FIG. 6A including thermally conductive protrusions from the bottom surface, according to some implementations of the present disclosure.
Figure 6A:
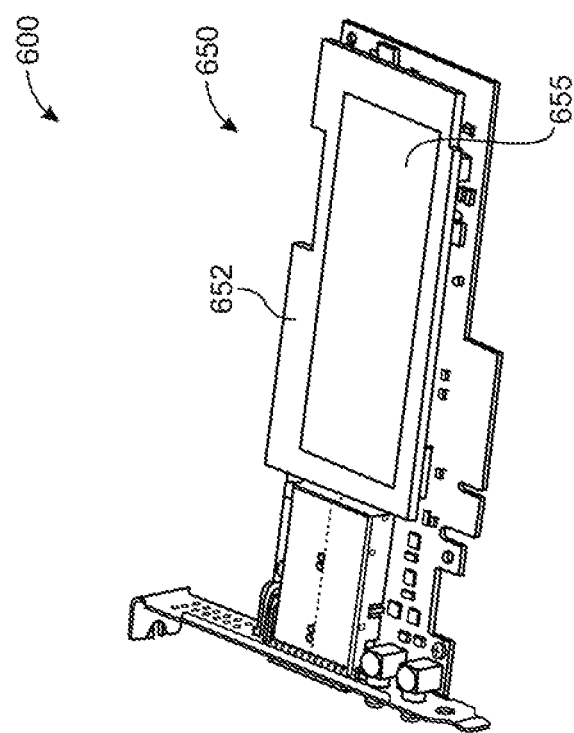
FIG. 6A depicts a top perspective view of an exemplary expansion card with heat-generating electronic components including a vapor chamber, according to some implementations of the present disclosure.

Turning now to FIG. 6A, a top perspective view of an exemplary expansion card 600 with heat-generating electronic components, such as the electronic components 310, 320, 330, 340 (FIG. 3A), is depicted. The expansion card 600 further includes a heat spreader 650 with a vapor chamber 655 positioned along a planar top surface 652 and a bottom surface 654 (see FIG. 6B). The heat spreader 650 assists with the transfer of heat energy away from the heat-generating electronic components to the heat sink. In some implementations, it is contemplated that the vapor chamber 655 can have a heat conductivity coefficient that is within a range of about 1,500 to 50,000 W/m-K.

Referring to FIG. 6B, a bottom perspective view of the heat spreader 650 of FIG. 6A, is depicted. The heat spreader 650 includes thermally-conductive protrusions 661, 662, 663, 664 extending from the bottom surface 654 of the heat spreader 650. The thermally-conductive protrusions 661, 662, 663, 664 are fabricated so that when the heat spreader 650 is placed over the expansion card 600, one or more of the thermally-conductive protrusions 661, 662, 663, 664 align vertically and horizontally with the top surfaces of the heat-generating electronic components (e.g., similar to electronic components 310, 320, 330, 340 in FIG. 3A). The thermally-conductive protrusions 661, 662, 663, 664 can be coupled to the heat-generating electronic components by an intermediate thermally-conductive layer, such as a thermal pad, thermal grease, or thermal paste, as described in FIG. 4. The thermally-conductive protrusions 661, 662, 663, 664 can be fabricated from the same thermally-conductive material as the heat spreader 650.

The vapor chamber 655 in FIG. 6A is disposed on the top surface 652 of the heat spreader 650 opposite to the plurality of thermally conductive protrusions, 661, 662, 663, 664 such that heat from the heat-generating electronic components (e.g., similar to electronic components 310, 320, 330, 340) is distributed along the heat spreader 650.

Figure 6C:
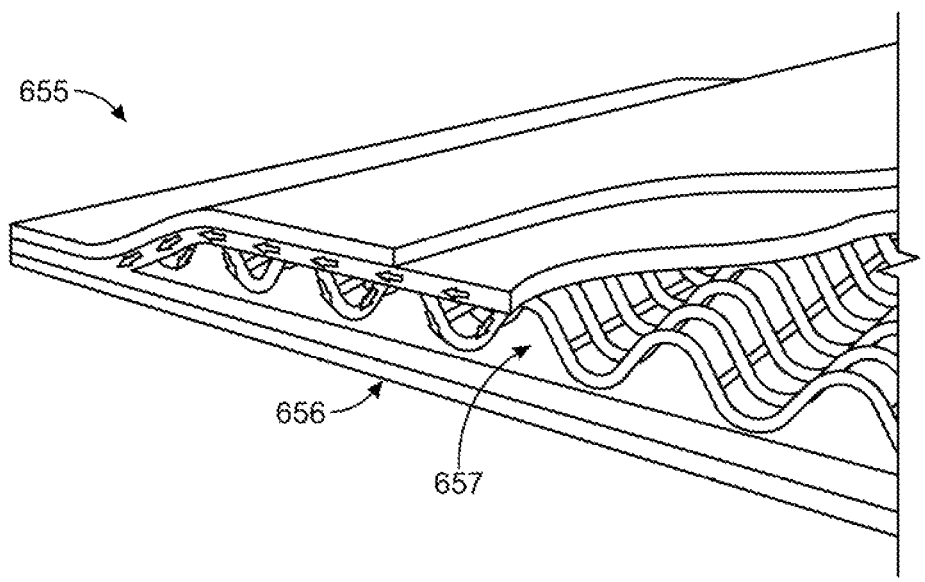
FIG. 6C depicts a cross-sectional perspective view through the vapor chamber of FIG. 6A, according to some implementations of the present disclosure.

Referring to FIG. 6C, a cross-sectional perspective view of the vapor chamber 655 of FIG. 6A is depicted, The heat spreader 650 (see FIG. 6A) is in direct contact with an underside 656 of the vapor chamber 655. A thermal pad, such as the thermal pad 443, 453 described for example in FIG. 4, places the vapor chamber 655 in thermal contact with the finned portion of the heat sink (e.g., similar to the plurality of fins 460 or 470 in FIG. 4) that dissipate heat to ambient air. The vapor chamber 655 includes a working fluid (e.g., water) that vaporizes in a chamber 657 and travels to cooler areas of the vapor chamber 655. The finned portion of the heat sink absorbs heat from the vapor chamber 655, thereby causing the vapor in the chamber 657 to condense into liquid form. This liquid is reabsorbed by a wick material and distributed, through capillary action, to the underside 656 of the vapor chamber 655. This above steps of vaporization and condensation forms a repetitive cycle of heat transfer from the heat-generating electronic components to the heat sink.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more Implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for at v given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not he interpreted in an idealized or overly formal sense unless expressly so defined herein.

What is claimed is:

1. A computing system comprising:
   a sealed computer chassis housing defining an interior space and an exterior surface with a heat sink for the interior space;
   a plurality of heat-generating electronic components disposed within the interior space and electrically coupled to one or more expansion cards electrically connected on a main board, the plurality of heat-generating electronic components including one or more microprocessors and one or more memory devices;
   a heat spreader including a plurality of thermally-conductive protrusions extending from a first surface of the heat spreader, adjacent ones of the plurality of thermally-conductive protrusions being separated by a gap across the first surface, the first surface of the heat spreader being opposite a second surface;
   an intermediate thermally-conductive layer positioned in thermal contact with and between (a) each of the plurality of thermally-conductive protrusions and (b) a respective one of the one or more microprocessors or the one or more memory devices; and
   a thermal pad positioned in thermal contact with the second surface of the heat spreader, the thermal pad being positioned adjacent to an interior wall of the sealed computer chassis housing opposite to the heat sink.

2. The computing system of claim 1, wherein the heat spreader includes one or more heat pipes.

3. The computing system of claim 2, wherein the heat pipes are disposed on the second surface of the heat spreader opposite to the plurality of thermally-conductive protrusions such that heat from the one or more microprocessors or the one or more memory devices is distributed along the heat spreader.

4. The computing system of claim 1, wherein the heat spreader includes a vapor chamber on the second surface of the heat spreader opposite to the plurality of thermally-conductive protrusions such that heat from the one or more microprocessors or the one or more memory devices is distributed along the heat spreader.

5. The computing system of claim 1, wherein the heat sink includes a plurality of fins protruding orthogonally to the exterior surface of the sealed computer chassis housing.

6. The computing system of claim 5, wherein the plurality of fins is oriented such that heat transferred to the heat sink rises out of air gaps between adjacent spaced fins.

7. The computing system of claim 5, wherein a height of the plurality of fins is greater than about five times a width of a gap between adjacent spaced fins.

8. The computing system of claim 1, wherein the heat sink includes one heat sink disposed on the exterior surface of a first side of the sealed computer chassis housing and a second heat sink disposed on the exterior surface of a second side of the sealed computer chassis housing.

9. The computing system of claim 1, wherein at least one expansion card is an expansion card for enhancing the computing system performance.

10. The computing system of claim 1, wherein the intermediate thermally-conductive layer includes thermally-conductive grease.

11. The computing system of claim 1, wherein the plurality of thermally-conductive protrusions includes protrusions of at least two different heights.

12. The computing device of claim 1, wherein the plurality of thermally conductive protrusions includes protrusions of at least two different heights.

13. A computing device comprising:
- a sealed server chassis housing defining an interior space and an exterior surface with a heat sink for the interior space;
- a heat source disposed within the interior space;
- a heat spreader including a plurality of thermally-conductive protrusions extending from a first surface of the heat spreader, the first surface of the heat spreader being opposite a second surface;
- an intermediate thermally-conductive layer positioned in thermal contact with and between (a) each of the plurality of thermally-conductive protrusions and (b) one or more components of the heat source; and
- a thermal pad positioned in thermal contact with the second surface of the heat spreader, the thermal pad being positioned in direct contact with an interior wall of the sealed server chassis housing opposite to the heat sink.

14. The computing device of claim 13, wherein the heat spreader includes one or more heat pipes.

15. The computing device of claim 13, wherein the heat spreader includes a vapor chamber on the second surface of the heat spreader opposite to the plurality of thermally conductive protrusions such that heat from the heat source is distributed along the heat spreader.

16. The computing device of claim 13, wherein the heat sink includes a plurality of fins protruding orthogonally to the exterior surface of the sealed server chassis housing.

17. The computing device of claim 13, wherein the heat sink includes one heat sink disposed on the exterior surface of a first side of the sealed server chassis housing and a second heat sink disposed on the exterior surface of a second side of the sealed server chassis housing.

18. The computing device of claim 13, wherein the intermediate thermally-conductive layer includes thermally-conductive grease.

* * * * *